United States Patent [19]
Neal et al.

[11] Patent Number: 6,154,834
[45] Date of Patent: *Nov. 28, 2000

[54] DETACHABLE PROCESSOR MODULE CONTAINING EXTERNAL MICROCODE EXPANSION MEMORY

[75] Inventors: James Neal, Cameron Park; David Mullane, El Dorado Hills; Bernardo Ortiz, Folsom, all of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/864,555

[22] Filed: May 27, 1997

[51] Int. Cl.⁷ ................................................. G06F 9/445
[52] U.S. Cl. .................... 712/248; 712/37; 712/38; 713/2; 361/736
[58] Field of Search ................................ 395/652, 384, 395/387; 713/2; 712/243, 248, 37, 38; 361/736

[56] References Cited

U.S. PATENT DOCUMENTS

| | | | |
|---|---|---|---|
| 4,399,505 | 8/1983 | Druke et al. | 712/246 |
| 5,274,829 | 12/1993 | Hotta et al. | 712/205 |
| 5,313,699 | 5/1994 | Freige et al. | 361/736 |
| 5,355,489 | 10/1994 | Bealkowski et al. | 713/2 |
| 5,371,869 | 12/1994 | Lee | 713/600 |
| 5,410,707 | 4/1995 | Bell | 713/2 |
| 5,481,713 | 1/1996 | Wetmore et al. | 717/5 |
| 5,495,518 | 2/1996 | Hayashi | 455/550 |
| 5,495,611 | 2/1996 | Bealkowski et al. | 713/2 |
| 5,623,665 | 4/1997 | Shimada et al. | 714/5 |
| 5,737,567 | 4/1998 | Whittaker et al. | 365/185.33 |
| 5,757,690 | 5/1998 | McMahon | 365/104 |
| 5,796,972 | 8/1998 | Johnson et al. | 712/208 |
| 5,796,974 | 8/1998 | Goddard et al. | 712/211 |
| 5,829,012 | 10/1998 | Marlan et al. | 711/102 |
| 5,950,012 | 9/1999 | Shiell et al. | 717/11 |
| 5,983,337 | 11/1999 | Mahalingaiah et al. | 712/32 |

*Primary Examiner*—Kenneth S. Kim
*Attorney, Agent, or Firm*—Blakely, Sokoloff, Taylor & Zafman LLP

[57] ABSTRACT

An electronic system and a processing unit supporting a flexible microcode space and Basic Input/Output System (BIOS) space. The electronic system features a first circuit board having a connector interconnected to a processing unit. The processing unit includes a second circuit board having an embedded controller and an on-substrate memory. The non-substrate memory is coupled to the embedded controller via a communication line routed through or placed on the second circuit board. In one embodiment, during a boot procedure and upon executing an instruction requesting data to be obtained from the on-substrate memory, the embedded controller obtains at least one microcode instruction from the on-substrate memory via the communication line.

18 Claims, 5 Drawing Sheets

DETACHABLE PROCESSOR MODULE CONTAINING EXTERNAL MICROCODE EXPANSION MEMORY

BACKGROUND OF THE INVENTION

1. Field of the Invention

This invention relates to the field of electronics. More particularly, the invention relates to an electronic system and method for increasing flexibility and availability of microcode space and of Basic Input/Output System (BIOS) memory space.

2. Description of Related Art

One of the most critical elements of a computer is its microprocessor. In general, a microprocessor is an embedded controller that includes a processor core featuring processing logic and core memory. In many architectures (e.g., INTEL® microprocessor architectures such as PENTIUM® and PENTIUM PRO™—trademarks owned by Intel Corporation of Santa Clara, Calif.), a portion of the core memory is reserved to contain microcode. This portion is commonly referred to as microcode space.

Referring to FIG. 1, microcode space 100 usually is minimally sized to achieve cost savings and separated into two areas; namely, a first area 110 and a second area 120. The first area 110 is configured to store a set of n microcode instructions $130_1$–$130_n$ ("μc instructions"), where "n" being a positive whole number. These microcode instructions $130_1$–$130_n$ are executed after power-up to perform one or more tasks (e.g., initialization of state machines, diagnostics, etc.). Smaller in size than the first area 110, the second area 120 is microcode space configured to store m microcode patch instructions (MPI) $140_1$–$140_m$ ("m" being a positive whole number). These microcode patch instructions $140_1$–$140_m$ form one or more microcode patches, which are used to correct errors found in one or more microcode instruction(s) after being preloaded in silicon or in process functionality. These microcode patches allow minor fixes in microcode without requiring chip refabrication.

As shown in FIG. 2, for computers, the microprocessor 200 is usually attached directly to a motherboard 210 through a multi-pin socket 220. In this embodiment, microprocessor 200 includes core memory 230 capable of containing microcode. A fixed portion of this core memory 230 is writable during execution of Basic Input/Output System (BIOS) code contained in on-substrate, non-volatile memory 240. The storage space of this non-volatile memory 240 (referred to as a BIOS memory space) is also fixed in size.

Over the last few years, some disadvantages concerning the loading of microcode patches have been uncovered. For example, in order to avoid refabrication of the processor core due to faulty microcode, BIOS memory space has been configured to provide a microcode patch, if necessary, corresponding to each microcode executed by processor 200. This requires BIOS memory space to be structured so that it is capable of supporting a microcode patch for each version of microprocessor (e.g., desktop, server, laptop, etc.). However, unless the size and associated cost of non-volatile memory 240 is greatly increased, the limited size of BIOS memory space places a restriction on the number of microcode instructions and/or patches that can be supported by conventional PC platforms.

Additionally, each type of microprocessor may require different sizes of microcode space. Since microprocessors and memory devices containing BIOS are typically manufactured and distributed by different original equipment manufacturers (OEMs), available BIOS memory space may not match the needs of a given microprocessor when it is otherwise manufacturable. One solution would be to implement more memory dedicated to BIOS. The addition of memory would substantially increase the cost of the end product, which adversely effects the consuming public.

Another disadvantage is that microcode patches currently are distributed by diskette or through an electronic bulletin board on the Internet. These microcode patches are subsequently loaded into memory 230 of FIG. 2. However, this is an expensive distribution technique. Distribution through an electronic bulletin board over a Wide Area Network (WAN) may be less costly than using diskettes, but it is not a universal solution because certain products containing the microprocessor may not have access to the electronic bulletin board.

Yet another disadvantage is that the current microcode patch scheme is subject to reliability concerns when upgrading a microprocessor. For example, if the user upgrades his or her computer to include a more advanced microprocessor, two reliability problems may result. The first reliability problem may occur if non-volatile memory 240 is too small to support a microcode patch recommended for the more advanced microprocessor. This would require upgrading the motherboard 200 and/or replacement of non-volatile memory 240 which is more difficult and expensive to the user.

Similarly, the second reliability problem involves the condition where the microcode space of the more advanced microprocessor is too small to support an intended microcode patch. This would require re-coding of the microcode or refabrication of core memory of the microprocessor to increase its sizing. The later solution is contrary to the present trend of minimizing the amount of dedicated memory in order to optimize the use of real estate on the processor core. Either reliability problem would be costly to both the OEM as well as the final consumer.

Furthermore, the current architecture does not encourage development of a standard processor architecture to support multiple modes of functionality. Instead, each processor is specifically manufactured and loaded with microcode to support a particular operation mode (e.g., support operations of a desktop computer, OVERDRIVE® processor, server, etc.). This lack of standardization is due in part to a limited microcode space.

Likewise, each processor is loaded with one instruction set of microcode because, until now, it was infeasible for processor 200 to have access to multiple instruction sets. For example, these instruction sets could be directed to controlling different processor platforms such as a complex instruction set computer (CISC) platform or a reduced instruction set computer (RISC) platform.

Therefore, it would be desirous to develop an electronic system and method of operation which overcomes the above-described disadvantages.

SUMMARY OF THE INVENTION

In one embodiment, the present invention relates to a processing unit featuring a substrate with an embedded controller and a memory unit attached to the substrate. The memory unit is loaded with microcode. The embedded controller is interconnected to the memory unit via a communication line. This communication line enables microcode to be transferred from the memory unit to the embedded controller.

BRIEF DESCRIPTION OF THE DRAWINGS

The features and advantages of the present invention will become apparent from the following detailed description of the present invention in which.

DESCRIPTION OF THE PREFERRED EMBODIMENT

The present invention relates to an electronic system and corresponding method for increasing flexibility and availability of microcode space and of Basic Input/Output System (BIOS) memory space. Herein, while certain details are set forth in order to provide a thorough understanding of the present invention, it is apparent to a person of ordinary skill in the art that the present invention may be practiced through many embodiments other than those illustrated. To avoid unnecessarily obscuring the present invention, certain well-known hardware and techniques are not set forth in detail.

In the following description, terminology is used to discuss certain features of the present invention. For example, an electronic system includes any type of computer or hardware product utilizing the present invention to enhance operability of its processor. A processor is any embedded controller, including processing logic and dedicated memory, which controls the operations of the electronic system. Examples of embedded controllers include microprocessors, microcontrollers, complex state machines and the like. A microcode patch is one or more microcode instructions provided to the processor for execution. A communication line is broadly defined as one or more information-carrying mediums (electrical wire, bus trace, fiber optics, etc.) or wireless communications through established techniques such as infrared (IR) and radio frequency (RF) signaling.

Figure 1:
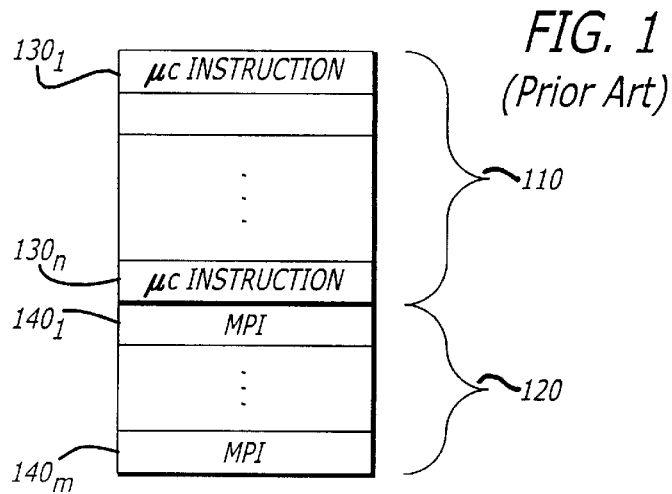
FIG. 1 illustrates conventional microcode space of a processor.
Figure 2:
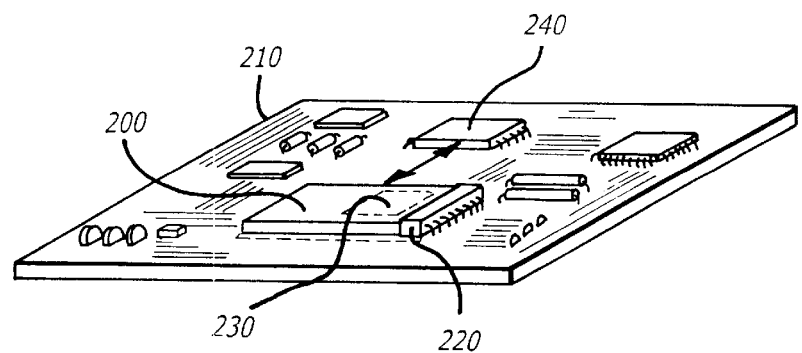
FIG. 2 is a conventional motherboard implementation.
Figure 3:
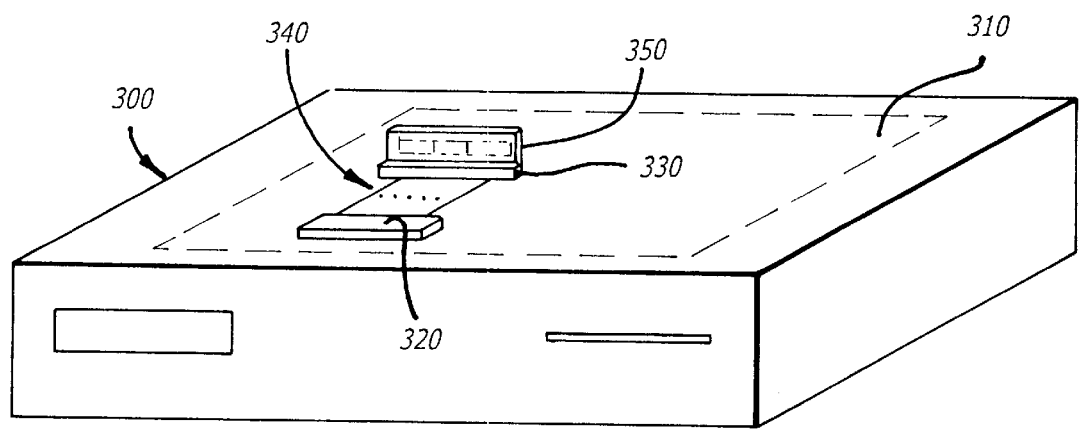
FIG. 3 is an illustrative embodiment of the electronic system including a processing unit implemented with the present invention.

Referring to FIG. 3, an illustrative embodiment of an electronic system 300 implemented with the present invention is shown. The electronic system 300 (e.g., a computer) includes a system substrate 310 which controls the overall functionality of the electronic system 300. Normally formed with any type of material or materials upon which integrated circuit components can be attached, the system substrate 310 includes a memory element 320 and a connector 330. The memory element 320 includes non-volatile memory such as Read Only Memory (ROM), erasable programmable ROM (EPROM), flash memory and the like, although volatile memory could be used. The memory element 320 is attached to system substrate 310 and is connected to communication line 340. Communication line 340 is routed to connector 330 in order to establish communications between memory element 320 and a processing unit 350 coupled to the connector 330. Although connector 330 is shown as a standard female edge connector, any other style of connector may be used (e.g., a pin field connector).

Figure 4:
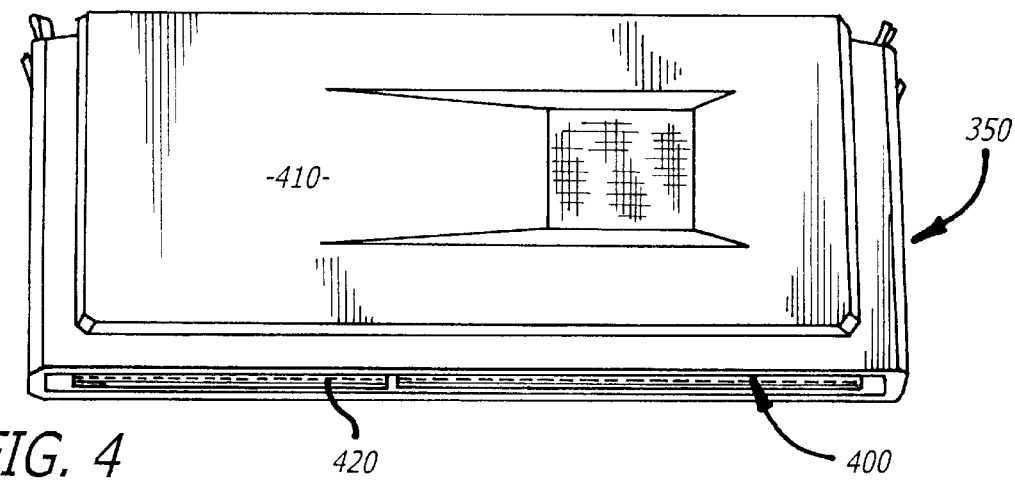
FIG. 4 is a perspective view of an embodiment of the processing unit including a package covering a substrate.

Referring now to FIG. 4, processing unit 350 includes a processor substrate 400 formed from any type of material upon which integrated circuit components (not shown) can be attached through well-known techniques (e.g., solder connection, etc.). The processor substrate 400 is substantially covered by a package 410 in order to protect the integrated circuit components (not shown) from damage or harmful contaminants. The processor substrate 400 includes a connector 420, preferably adapted to establish a mechanical and electrical connection with connector 330. As shown, connector 420 includes any type of connector which mates with connector 330. In this embodiment, connector 420 includes a standard male edge connector.

Figure 5A:
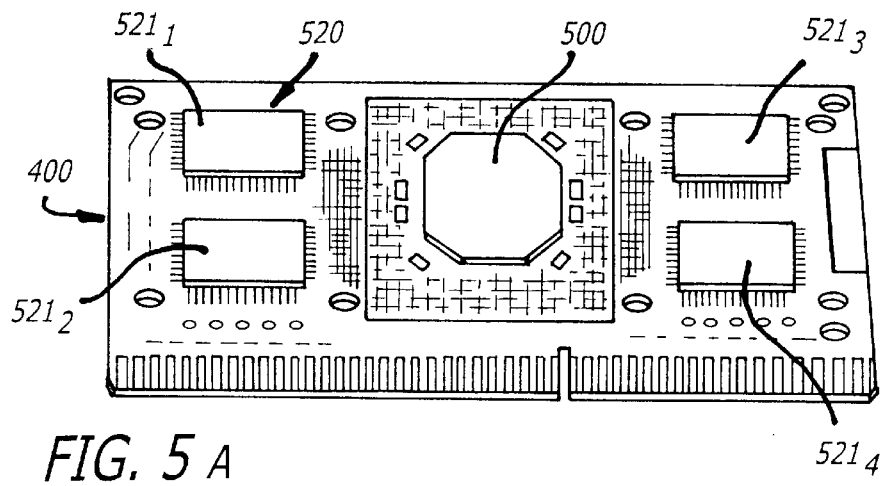
FIGS. 5A and 5B are each an illustrative embodiment of the processing unit including at least an embedded controller and at least one on-substrate memory unit.
Figure 5B:
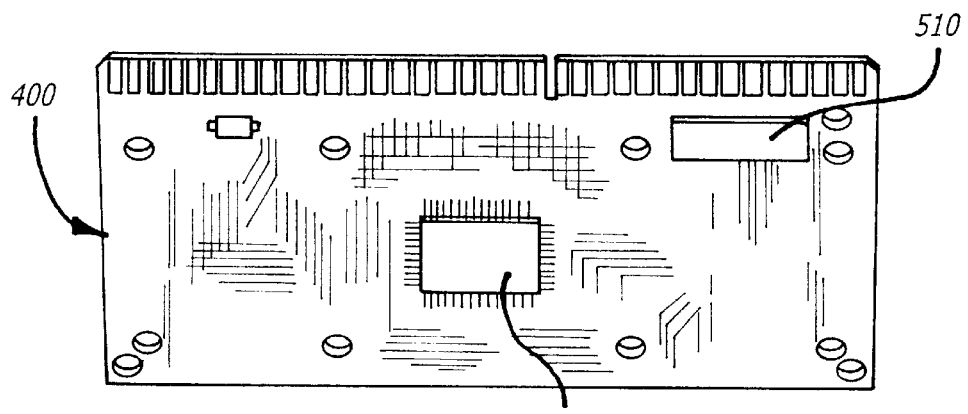

Referring to FIGS. 5A–5B, illustrative embodiments of a top side and bottom side of processor substrate 400 are shown. The integrated circuit components of processor substrate 400 include, but are not limited or restricted to, at least one processor 500 and on-substrate memory. Of course, although not shown, discrete components (e.g., capacitors, oscillators, resistors, inductors, etc.) would be attached to processor substrate 400 in a selected manner to, among other things, maximize routability and decrease length of communication lines between these integrated circuit components.

As shown, processor 500 is a single microprocessor but may include one or more microprocessors or any other embedded controller. The on-substrate memory includes at least one memory unit 510 and possibly a cache subsystem 520. Cache subsystem 520 includes a plurality of memory components $521_1$–$521_4$ such as static random access memory (SRAM) components in communication with processor 500. Cache subsystem 520 further includes a tag RAM 522 used for supporting any cache coherency protocol (e.g., Modified, Exclusive, Shared, Invalid MESI cache protocol) collectively used by memory components $521_1$–$521_4$.

The on-substrate memory unit 510 would include, but not limited or restricted to, non-volatile memory such as ROM, EPROM, flash memory and the like. Memory unit 510 is situated on processor substrate 400 and is configured to potentially communicate with processor 500 and/or memory element 320 during a boot procedure. The location of on-substrate memory unit 510 is a design choice so long as the communication path meets requisite latency goals. For example, on-substrate memory unit 510 may be attached to processor substrate 400 or possibly mounted onto processor 500 through a stacking technology.

One function of on-substrate memory unit 510 is to provide additional storage space for microcode executed by processor 500. This microcode may include one or more microcode patches that are pre-loaded to support a variety of operation modes. For example, if processor 500 possesses an INTEL® microprocessor architecture, processor 500 may be configured to operate in several operation modes without architectural modifications. Examples of these operation modes include operations as a desktop processor, an OVER-DRIVE® processor, mobile processor, or a server processor. Memory unit 510 may be loaded with microcode patches for each of the operation modes, although only one will be requested.

Another function of on-substrate memory unit 510 is to provide additional storage space for supporting various types of microcode instruction sets. These instruction sets could be directed to complex instruction set computer (CISC) platforms, reduced instruction set computer (RISC) platforms and the like.

Figure 6:
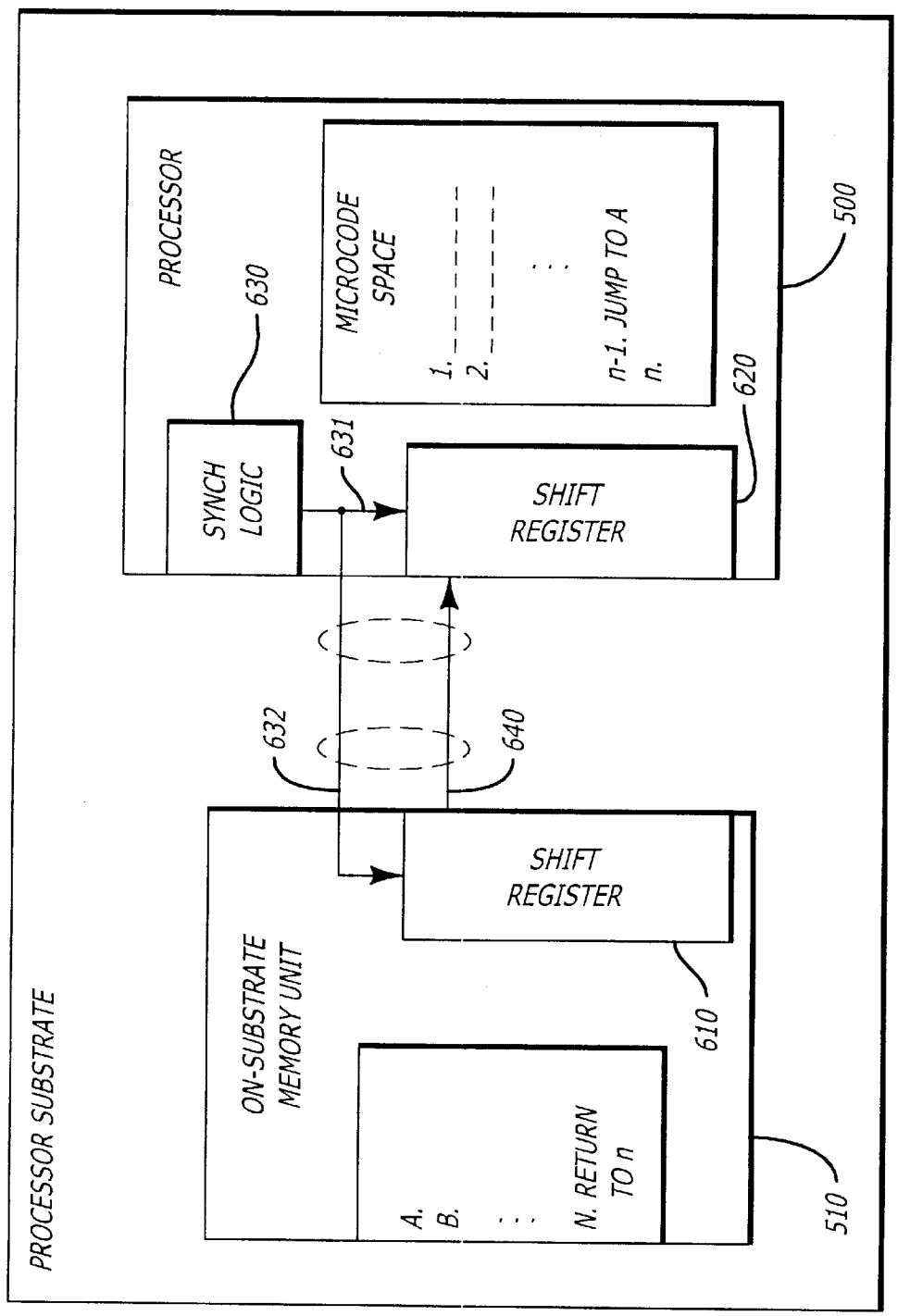
FIG. 6 is a first illustrative embodiment of the communication scheme between the processor and the on-substrate memory unit.

Referring to FIG. 6, an illustrative embodiment of one communication scheme used to route data from the on-substrate memory unit 510 into the processor 500 of FIG. 5 is shown. In this embodiment, on-substrate memory unit 510 is implemented as a standard serial ROM, requiring serial communications to processor 500. If serial data transmissions are supported, processor 500 would need to be aware of the depth of the memory unit 510 because the addressing of particular microcode instructions is not available. Herein, serial transmission is a chosen embodiment for its cost-effectiveness and its minimal impact on processor size.

It is contemplated, however, that a number of other embodiments may be implemented. For example, in lieu of a serial ROM, another type of non-volatile memory supporting serial communications may be used. Alternatively, processor 500 may communicate with on-substrate memory unit 510 through a dedicated parallel bus. This type of embodiment would likely be used in supporting multiple instruction sets such as CISC and RISC based microcode. However, it would have substantial impact on processor lead count (e.g., pin count) because multiple data and/or address leads would be needed besides reset and other control pins.

Referring still to FIG. 6, the communication scheme includes a pair of shift elements (e.g., shift registers) 610 and 620, and a synchronization logic circuit 630. A first shift element 610 is adapted to control data transmissions into and/or from a data lead of the on-substrate memory unit 510. Likewise, a second shift element 620 is adapted to control data transmission into and/or from a data lead of processor 500. These shift elements 610 and 620 are synchronously clocked by synchronization logic circuit 630 through clock lines 631 and 632. The clock lines 631 and 632 provides clocking to control the transmissions of information, namely microcode instructions from first shift element 610. It is contemplated that (i) first shift element 610 may be implemented within on-substrate memory unit 510, and/or (ii) second shift element 620 may be implemented within processor 500, although these specific implementations are not required.

The shift elements 610 and 620 are further coupled together through an interconnect including a serial data line 640. Serial data line 640 provides the routing for such data to the second register 620. The interconnect may further be used as a debug mechanism by loading a potential microcode patch into the on-substrate memory unit 510, and monitoring the serial data line 640 during boot procedure of processor 500 in order to observe what microcode instructions are being transferred through serial data line 640 and whether resultant operations are as intended.

Figure 7:
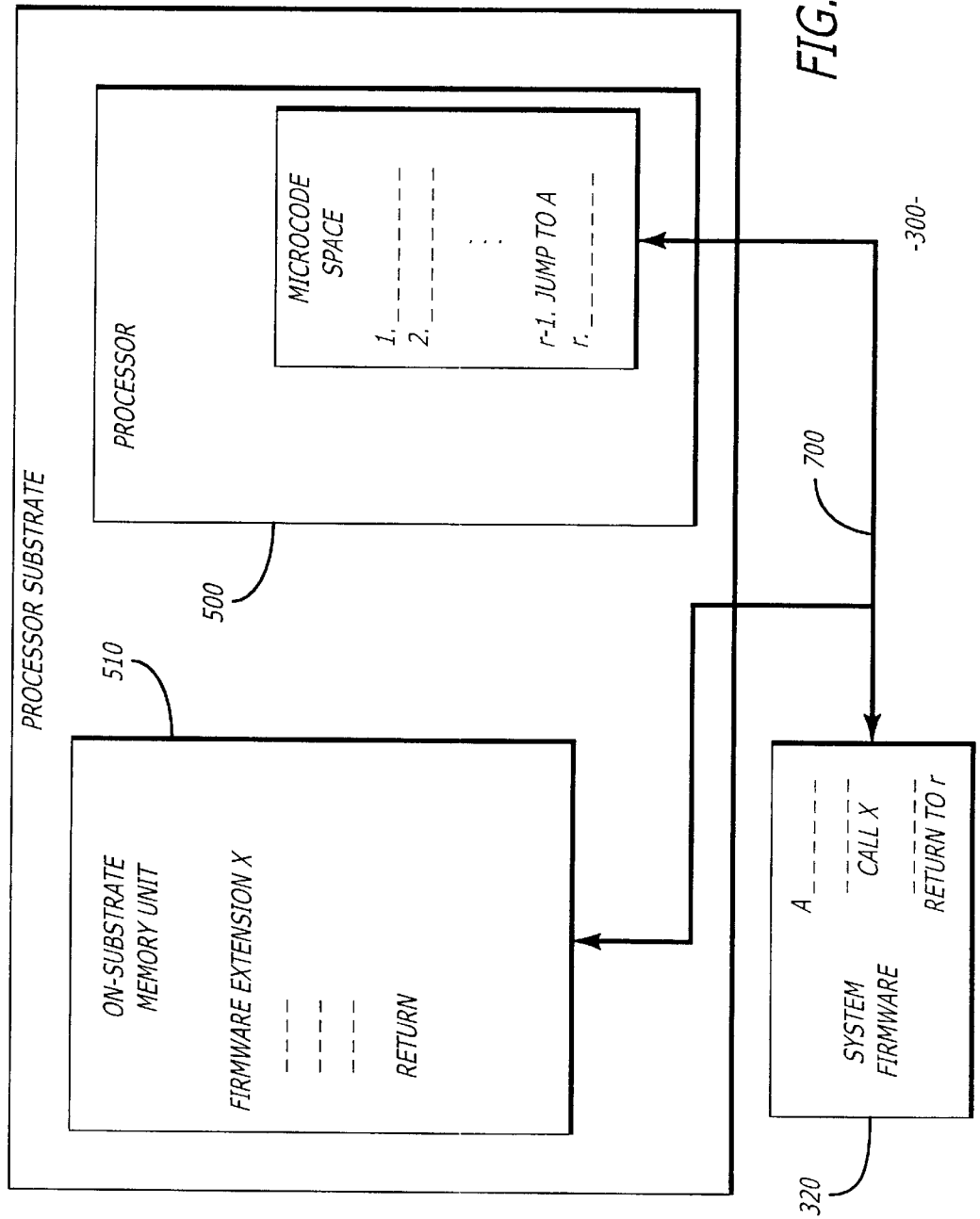
FIG. 7 is a second illustrative embodiment of the communication scheme between the processor, on-substrate memory containing BIOS and the on-substrate memory unit.

Referring now to FIG. 7, an illustrative embodiment of an alternative communication scheme is shown in which microcode patches are accessed during BIOS access of the boot procedure. This scheme involves communications between (i) processor 500 and on-substrate memory unit 510 situated on processor substrate 400 and (ii) memory element (e.g., system firmware) 320 placed on system substrate 300. In this embodiment, system firmware 320 is connected to processor 500 through a communication line 700. The communication line 700 includes at least address and data communication lines, which may be configured to support any bit width including 32-bit and 64-bit, respectively. The communication line 700 is further coupled to on-substrate memory unit 510.

Figure 8:
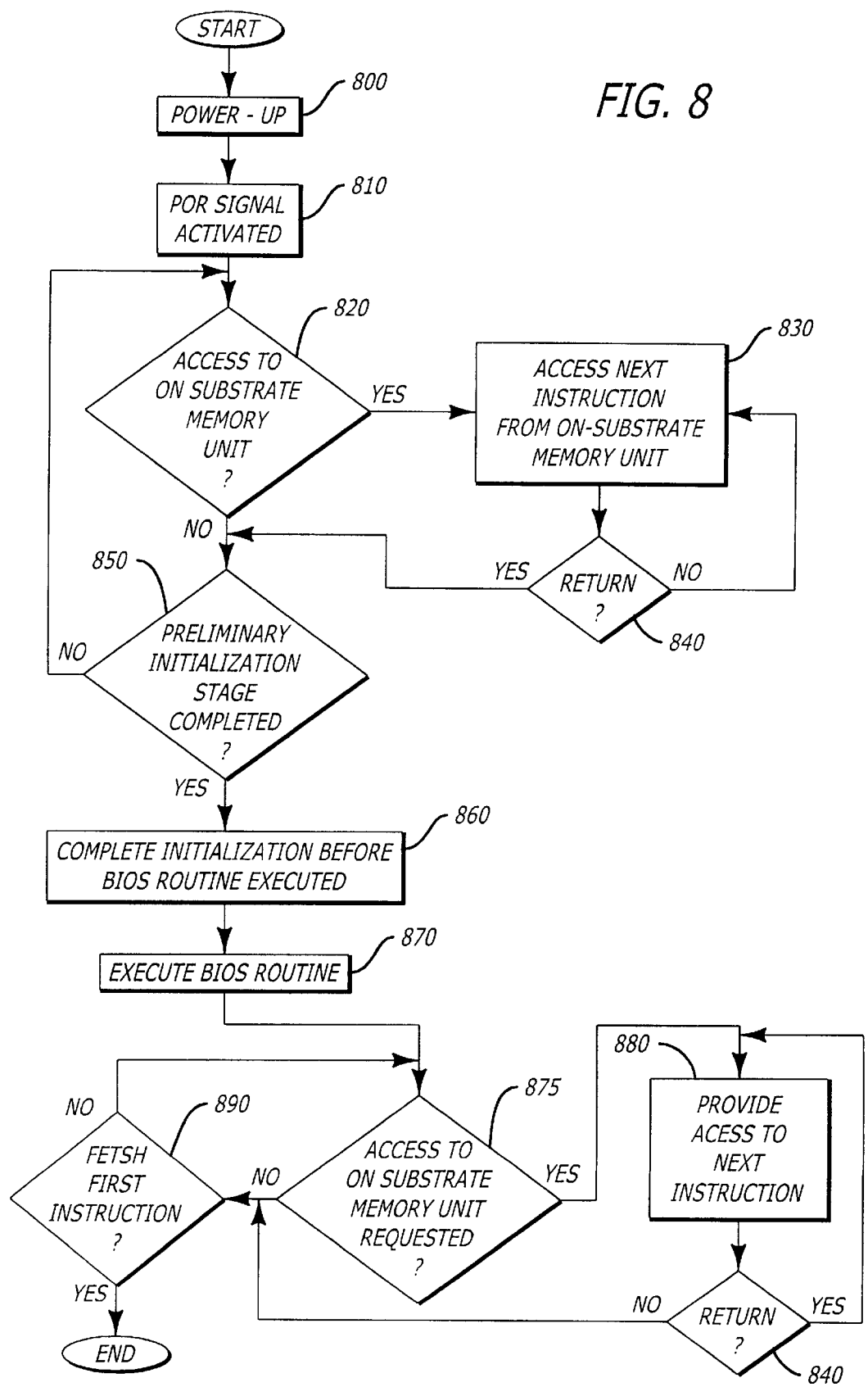
FIG. 8 is an illustrative flowchart of the operations of the present invention.

During execution of the microcode instructions loaded in its microcode space, processor 500 may execute a microcode branch instruction such as a JUMP microcode instruction to a selected address ("A"). This would cause processor 500 to successively access one or more microcode instructions starting at the selected address location which falls within an address range associated with system firmware 320. However, instead of implementing the entire microcode patch to be accessed by processor 500, system firmware 320 includes a microcode instruction directing processor 500 to access one or more subsequent microcode instructions from on-substrate memory unit 510. This allows system firmware 320 to support multiple microcode patches and firmware extensions, while freeing up its available space reserved for BIOS. Referring to FIG. 8, a flowchart of the boot procedure performed by the electronic system of FIG. 3 is shown. First, the processor core is powered-up (Step 800). Thereafter, a Power-On Reset (RESET) signal is activated, which triggers a preliminary initialization stage in which certain state machines implemented in the processor core are initialized (Block 810). This preliminary initialization stage is performed through execution of a number of microcode instructions loaded in microcode space. During execution of each of these microcode instructions, a determination is made whether the microcode instruction requires an access of contents stored in the on-substrate memory unit for the next microcode instruction (Block 820). This may be accomplished by checking for a certain address range, for a microcode branch instruction (e.g., a JUMP instruction) and the like.

If the instruction requires access of the contents of the on-substrate memory unit, further instructions are accessed from on-substrate memory unit until an instruction indicates a return to the microcode space of the processor (Blocks 830 and 840). This may be accomplished through a RETURN instruction or addressing a specific address reserved for the microcode space. In this event or the case where the microcode instruction does not require accessing the contents of the on-substrate memory unit, a check is made as to whether the preliminary initialization stage has been completed (Block 850). If further microcode instructions need to be executed to complete the preliminary initialization stage, the process continues from Block 820 for the next microcode instruction. The preliminary initialization stage occurs between activation and inactivation of the RESET signal.

After the RESET signal goes inactive, initialization of other state machines (e.g., Advanced Programmable Interrupt Controllers) and setting the operation mode of the processor is completed (Block 860). Thereafter, BIOS within the memory element situated on the system substrate is executed (Block 870). During execution, memory space in BIOS reserved for microcode patches is accessed. The memory space may include an instruction requesting access the next instruction from the on-substrate memory unit in order to free up BIOS memory space (Block 875). In this event, instructions are accessed from on-substrate memory unit until returned to the memory element (Blocks 880 and 885). Thereafter, accesses are continued in BIOS memory space until the operating system (OS) is booted and the first instruction is fetched (Block 890).

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An electronic system comprising:
a first circuit board including a first connector; and
a processing unit coupled to the first circuit board, the processing unit including
a package,
a second circuit board substantially covered by the package, the second circuit board including a second connector protruding from the package for attachment to the first connector,
an embedded controller mounted onto the second circuit board at a first location and covered by the package, the embedded controller including an internal core memory to contain microcode, and
an on-substrate memory unit mounted on the second circuit board at a second location different than the first location and in communication with the embedded controller, the on-substrate memory unit containing additional microcode executable by the embedded controller.

2. The electronic system of claim 1, wherein the processing unit further includes a communication line coupling the embedded controller and the on-substrate memory unit, the communication line enables the microcode to be transferred to the embedded controller.

3. The electronic system of claim 2, wherein the communication line of the processing unit includes at least one bus trace routed through the second substrate.

4. The electronic system of claim 2, wherein the communication line of the processing unit includes a serial bus.

5. The electronic system of claim 4, wherein embedded controller of the processing unit includes a first shift element coupled to the serial bus and the on-substrate memory unit includes a second shift element coupled to the serial bus.

6. The electronic system of claim 5, wherein the processing unit further includes a synchronization circuit providing a synchronous clock signal to the first shift element and the second shift element.

7. The electronic system of claim 1, wherein the microcode loaded in the on-substrate memory unit includes a plurality of microcode patches, each microcode patch associated with a select operation mode of the processing unit.

8. The electronic system of claim 1, wherein the microcode loaded in the on-substrate memory includes an instruction set for at least one of a complex instruction set computer (CISC) platform and a reduced instruction set computer (RISC) platform.

9. The electronic system of claim 7, wherein the select operation mode is an operation mode for a desktop processor.

10. The electronic system of claim 7, wherein the selected operation mode is an operation mode for an OVERDRIVE® processor.

11. The electronic system of claim 7, wherein the select operation mode is an operation mode for a server processor.

12. The electronic system of claim 7, wherein the second location of the second circuit board is a backside of the second circuit board.

13. An electronic system comprising:
a system circuit board including a first connector;
a processing unit coupled to the system circuit board, the processing unit including
a package,
a processor circuit board substantially covered by the package, the processor circuit board including a second connector protruding from the package for attachment to the first connector,
an embedded controller coupled to the processor circuit board at a first location and covered by the package, the embedded controller including an internal core memory having a microcode space to contain microcode, and
an on-substrate memory unit coupled to the processor circuit board at a second location different than the first location and covered by the package, the on-substrate memory unit containing microcode executable by the embedded controller; and
a system firmware attached to the system circuit board and in communication with the embedded controller and the on-substrate memory unit, the system firmware is accessed to initiate a boot procedure and includes at least one microcode instruction, which when executed by the embedded controller, allows the microcode located in the on-substrate memory unit to be read and executed by the embedded controller during a boot procedure.

14. The electronic system of claim 13, wherein the system substrate includes a first connector and the processor substrate of the processing unit includes a second connector capable of mating with the first connector.

15. The electronic system of claim 13 further comprising a plurality of communication lines coupled to the embedded controller, the on-substrate memory unit and the system firmware, the plurality of communication lines enable data and address to be transferred at least from the embedded controller to both the on-substrate memory unit and the system firmware.

16. The electronic system of claim 13, wherein the system firmware includes a non-volatile memory.

17. The electronic system of claim 13, wherein the on-substrate memory unit includes a non-volatile memory.

18. The electronic system of claim 13, wherein the second location of the processor circuit board is a backside of the processor circuit board.

* * * * *